(12) United States Patent
Tseng

(10) Patent No.: US 9,866,234 B1
(45) Date of Patent: Jan. 9, 2018

(54) DIGITAL-TO-ANALOG CONVERTER

(71) Applicant: QUALCOMM Incorporated, San Diego, CA (US)

(72) Inventor: Yi-Hung Tseng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/589,684

(22) Filed: May 8, 2017

(51) Int. Cl.
| | |
|---|---|
| *H03M 1/66* | (2006.01) |
| *H03M 1/06* | (2006.01) |
| *G06F 1/10* | (2006.01) |
| *H03M 1/74* | (2006.01) |
| *H03K 5/24* | (2006.01) |
| *H03M 1/00* | (2006.01) |
| *H03K 19/003* | (2006.01) |

(52) U.S. Cl.
CPC ........... *H03M 1/66* (2013.01); *H03M 1/0617* (2013.01); *G06F 1/10* (2013.01); *H03K 5/2481* (2013.01); *H03K 19/00315* (2013.01); *H03K 19/00361* (2013.01); *H03M 1/00* (2013.01); *H03M 1/745* (2013.01); *H03M 1/747* (2013.01)

(58) Field of Classification Search
CPC ........ H03M 1/747; H03M 1/00; H03M 1/745; H03K 19/00315; H03K 5/2481; H03K 19/00361; G06F 1/10

USPC ........... 341/144, 150, 136, 135; 326/83, 93; 327/384, 65
See application file for complete search history.

(56) References Cited

U.S. PATENT DOCUMENTS

| | | | |
|---|---|---|---|
| 7,551,021 | B2 | 6/2009 | Florescu |
| 7,872,531 | B1 | 1/2011 | Dhanasekaran |
| 8,854,087 | B2 | 10/2014 | Peters et al. |
| 2002/0044076 | A1* | 4/2002 | Yao .................. H03K 17/04106 341/136 |
| 2013/0293282 | A1 | 11/2013 | Rotem et al. |
| 2016/0125937 | A1 | 5/2016 | Kang |

* cited by examiner

*Primary Examiner* — Joseph Lauture
(74) *Attorney, Agent, or Firm* — Patterson & Sheridan, L.L.P.

(57) ABSTRACT

Certain aspects of the present disclosure provide digital-to-analog converters (DACs). One example DAC generally includes a first transistor configured to selectively couple a power source to a load. In a first mode of operation of the DAC, the first transistor is closed and couples the load to the power source. In a second mode of operation of the DAC, the first transistor is open and decouples the load from the power source. The DAC further includes a current limiting circuit selectively coupled between the first transistor and a reference voltage. In the first mode, the current limiting circuit is decoupled from the reference voltage. In the second mode, the current limiting circuit is coupled to the reference voltage.

30 Claims, 12 Drawing Sheets

DIGITAL-TO-ANALOG CONVERTER

TECHNICAL FIELD

Certain aspects of the present disclosure generally relate to electronic circuits and, more particularly, to a digital-to-analog converter (DAC).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

In order to transmit or receive data and/or control information, the radio frequency front end of the base station and/or the mobile station may include one or more frequency synthesizers to generate oscillating signals used for upconverting baseband signals and downconverting radio frequency (RF) signals. In certain implementations one or more of the frequency synthesizers include a digitally-controlled oscillator (DCO), which may be part of a phase lock loop (PLL), for tuning an oscillating signal to different frequencies. Synthesizers may also be used in other locations within the base station and/or mobile station and/or in other devices.

SUMMARY

Certain aspects of the present disclosure generally relate to techniques and apparatus for reducing leakage compensation in a digital-to-analog converter (DAC). The DAC may provide a control signal to drive a voltage-controlled oscillator (VCO). The combination of a VCO and DAC may be referred to as a digitally controlled oscillator (DCO).

Certain aspects of the present disclosure provide a digital-to-analog converter (DAC). The DAC includes a first transistor configured to selectively couple a power source to a load. In a first mode of operation of the DAC, the first transistor is closed and couples the load to the power source. In a second mode of operation of the DAC, the first transistor is open and decouples the load from the power source. The DAC further includes a current limiting circuit selectively coupled between the first transistor and a reference voltage. In the first mode the current limiting circuit is decoupled from the reference voltage and in the second mode the current limiting circuit is coupled to the reference voltage.

Certain aspects of the present disclosure provide a method for operating a digital-to-analog converter (DAC). The method includes enabling a first mode of operation of a DAC. In the first mode, a first transistor is closed and couples a load to a power source, and a current limiting circuit selectively coupled between the first transistor and a reference voltage is decoupled from the reference voltage. The method further includes enabling a second mode of operation of the DAC. In the second mode, the first transistor is open and decouples the load from the power source, and the current limiting circuit is coupled to the reference voltage.

Certain aspects of the present disclosure provide a digital-to-analog converter (DAC). The DAC includes means for selectively coupling a power source to a load. In a first mode of operation of the DAC the load is coupled to the power source. In a second mode of operation of the DAC the load is decoupled from the power source. The DAC further includes means for selectively coupling a current limiting circuit between the power source and a reference voltage. In the first mode the current limiting circuit is decoupled from the reference voltage and in the second mode the current limiting circuit is coupled to the reference voltage.

Certain aspects of the present disclosure provide an apparatus. The apparatus may be used to convert a digital signal to an analog signal. The apparatus may include a first transistor coupled between ground and a first node. A gate of the first transistor may be coupled to a first control signal. The apparatus may further include a second transistor coupled between the first node and a load. A gate of the second transistor may be coupled to a bias voltage. The apparatus may further include a third transistor having a gate and a source coupled to the first node and a fourth transistor coupled between a drain of the third transistor and a power supply. A gate of the fourth transistor may be coupled to a second control signal.

Certain aspects of the present disclosure provide another apparatus. The apparatus may be used to convert a digital signal to an analog signal. The apparatus may include a first transistor coupled between a power supply and a first node. A gate of the first transistor may be coupled to a first control signal. The apparatus may further include a second transistor coupled between the first node and a load. A gate of the second transistor may be coupled to a bias voltage. The apparatus may further include a third transistor having a gate and a source coupled to the first node and a fourth transistor coupled between a drain of the third transistor and ground. A gate of the fourth transistor may be coupled to a second control signal.

Certain aspects of the present disclosure provide a method for operating a digital-to-analog converter (DAC). The method may include closing a first transistor of the DAC to couple a load to a power source, decoupling a current limiting circuit selectively coupled between the first transistor and a reference voltage from the reference voltage while the first transistor is closed, opening the first transistor to decouple the load from the power source, and coupling the current limiting circuit to the reference voltage while the first transistor is open.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
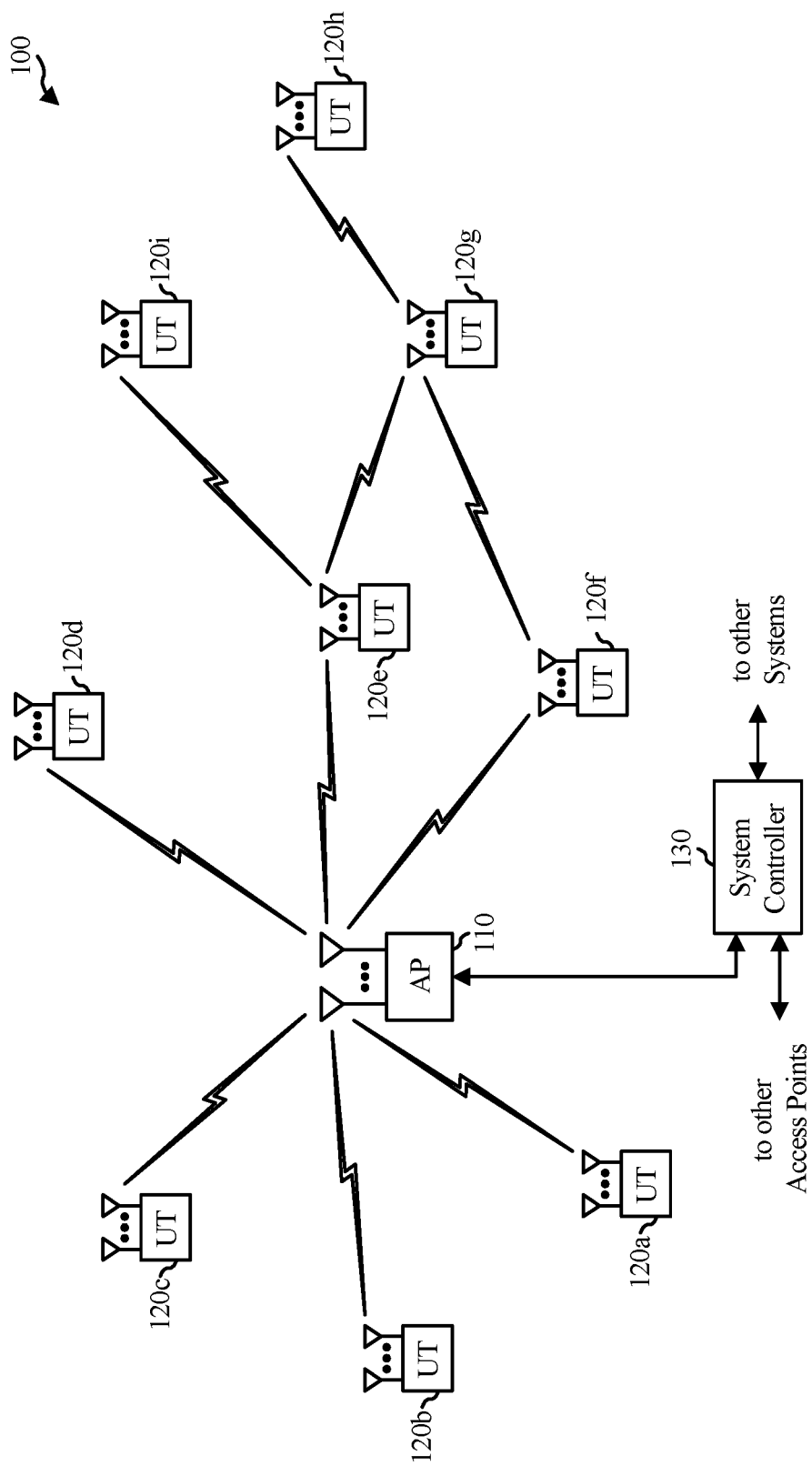
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more frequency synthesizers (e.g., phase lock loops (PLLs)) to generate periodic signals used for signal transmission and/or reception. At least one of the frequency synthesizers may include a DCO implementing elements and/or techniques as described herein.

While certain of the terminology used herein may refer to elements more commonly associated with a wireless local area network, implementations may include a wide area network or other wireless networks. For example, the AP 110 may instead be implemented as a base station in one of the cellular networks recited above.

Figure 2:
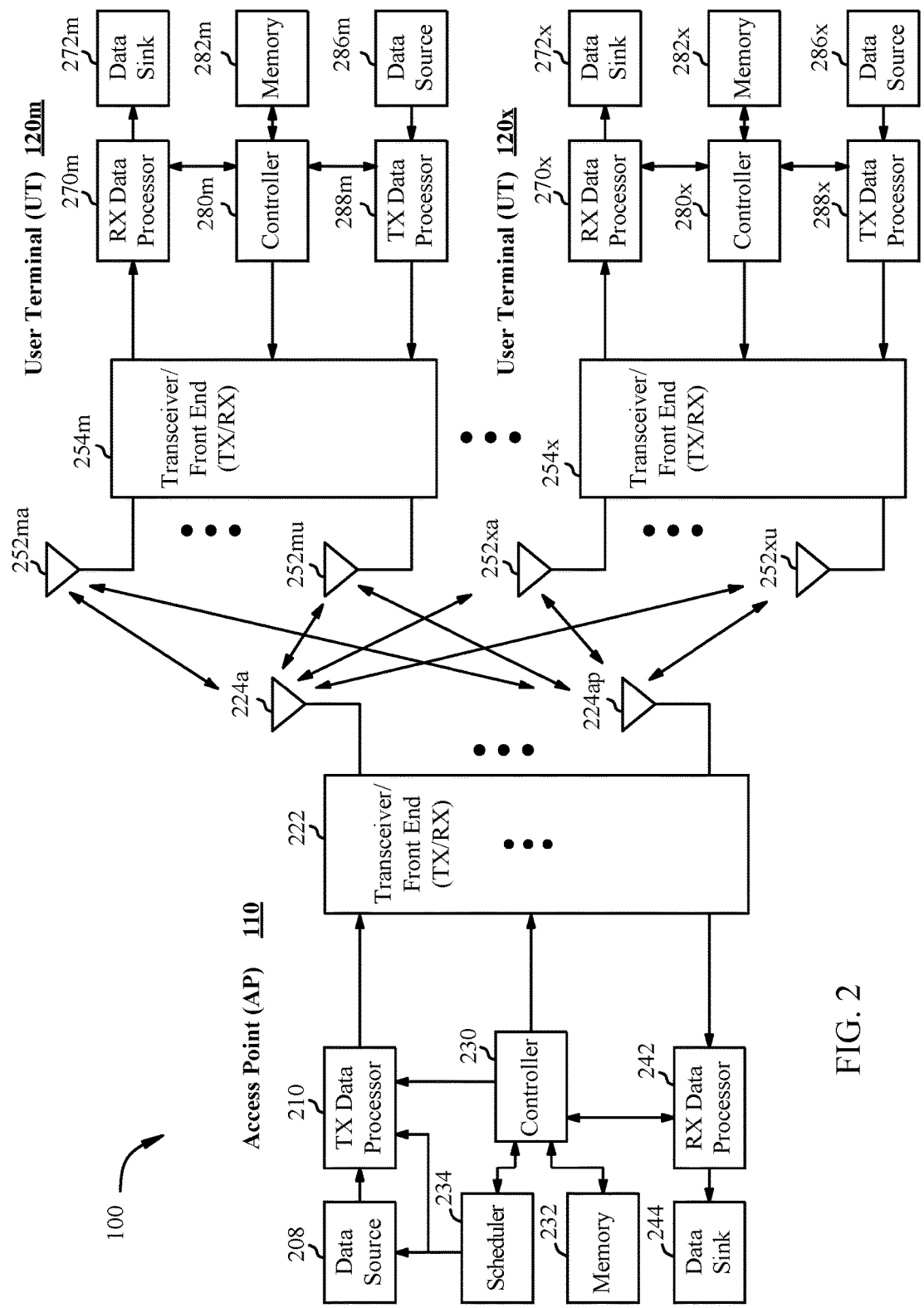
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. In some embodiments, the access point 110 is instead implemented as a base station. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals may be selected for simultaneous transmission on the uplink, $N_{dn}$ user terminals may be selected for simultaneous transmission on the downlink, $N_{up}$ may or may not be equal to $N_{dn}$, and $N_{up}$ and $N_{dn}$ may be static values or can change for each scheduling interval. Beamsteering or some other spatial processing technique may be used at the access point, base station, and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver/front end (TX/RX) 254 (also known as a radio frequency front end (RFFE)) receives and processes (e.g., converts to analog, amplifies, filters, and frequency upconverts) a respective symbol stream to generate an uplink signal. The transceiver/front end 254 may also route the uplink signal to one of the $N_{ut,m}$ antennas for transmit diversity via an RF switch, for example. The controller 280 may control the routing within the transceiver/front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver/front end 222 may select signals received from one of the antennas 224 for processing. The signals received from multiple antennas 224 may be combined for enhanced receive diversity. The access point's transceiver/front end 222 also performs processing complementary to that performed by the user terminal's transceiver/front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver/front end (TX/RX) 222 of access point 110 and/or transceiver/front end 254 of user terminal 120 may include one or more frequency synthesizers to generate oscillating signals used for signal transmission and/or reception. At least one of the frequency synthesizers may include a may include a DCO implementing elements and/or techniques, for example for leakage compensation in a DAC of the DCO, in accordance with certain aspects of the present disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver/front end 222 receives and processes (e.g., converts to analog, amplifies, filters, and frequency upconverts) the symbol stream to generate a downlink signal. The transceiver/front end 222 may also route the downlink signal to one or more of the $N_{ap}$ antennas 224 for transmit diversity via an RF switch, for example. The controller 230 may control the routing within the transceiver/front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver/front end 254 may select signals received from one of the antennas 252 for processing. The signals received from multiple antennas 252 may be combined for enhanced receive diversity. The user terminal's transceiver/front end 254 also performs processing complementary to that performed by the access point's transceiver/front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof, among other systems/schemes.

Figure 3:
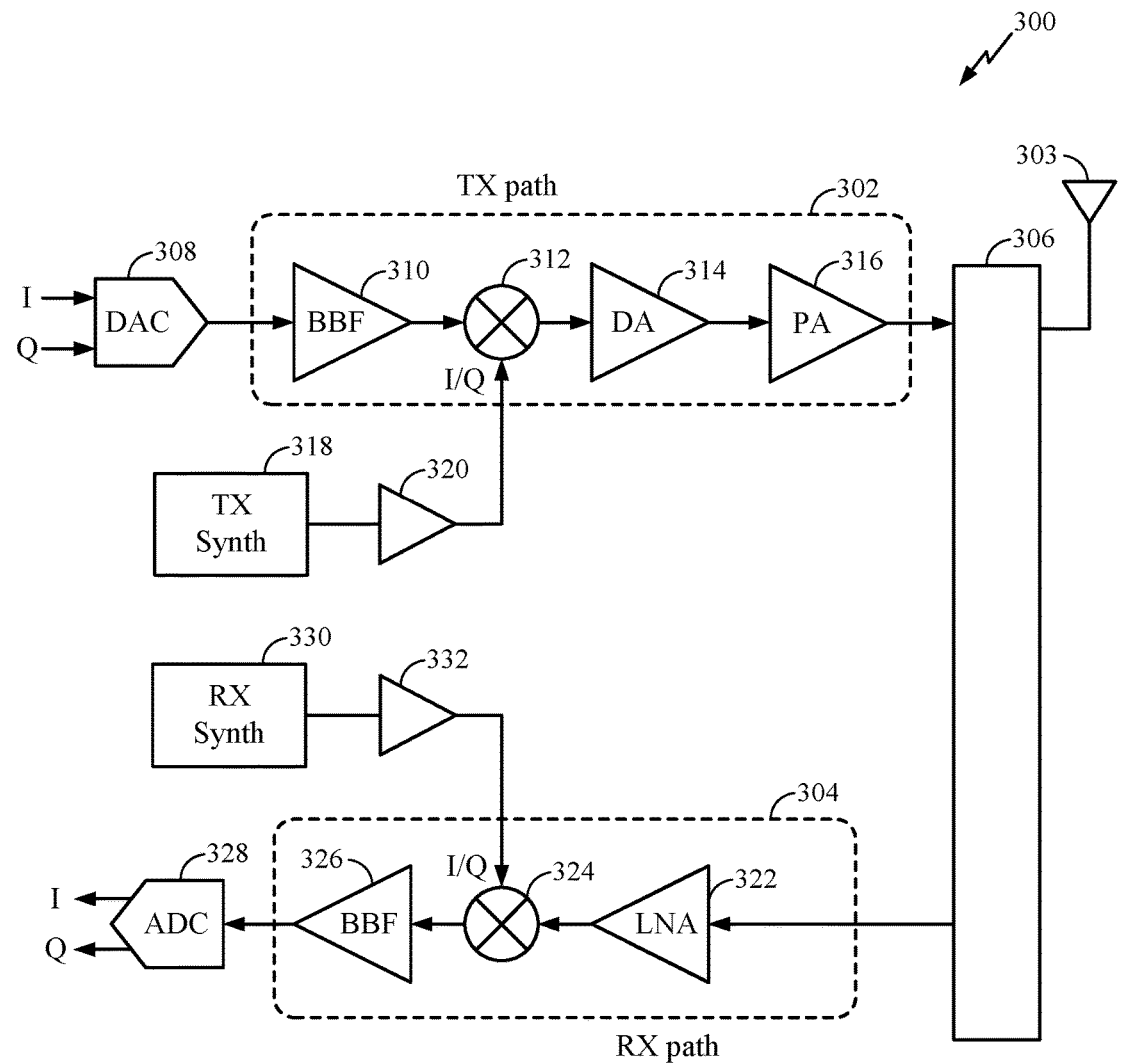
FIG. 3 is a block diagram of an example transceiver/front end, in accordance with certain aspects of the present disclosure.

FIG. 3 is a block diagram of an example transceiver/front end 300, such as transceiver/front ends 222, 254 in FIG. 2, in accordance with certain aspects of the present disclosure. The transceiver/front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The DAC 308 may implement the techniques for leakage compensation in a DAC, in accordance with certain aspects of the present disclosure. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which may involve compromises between stability and tunability. Contemporary systems may employ frequency synthesizers with a DCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

The TX frequency synthesizer 318 and/or RX frequency synthesizer 330 may comprise a DCO implementing elements and/or techniques in accordance with certain aspects of the present disclosure. In some embodiments, such elements and techniques provide leakage compensation in a DAC of the DCO, for example in a current mode DAC. The disclosure, however, is not limited to such embodiments. Elements and techniques described herein may be implemented in association with a DAC in many other contexts. In some aspects, the embodiments and/or techniques described herein may be implemented in contexts in which fine current control is desired and it is acceptable to divert leakage or remove current.

Example Digital-to-Analog Converter (DAC)

A digital-to-analog converter (DAC) may be used in a wide variety of applications, such as in a frequency synthesizer (e.g., phase-locked loop (PLL)), as discussed. In a frequency synthesizer, a digitally-controlled oscillator (DCO) may need to operate over a wide range of frequencies. Further, the frequency (f) of the DCO may be proportional to the current (I) through the DCO and the capacitance (C) of the DCO (e.g., $\propto I/C$). The capacitance C of the DCO may be fixed (e.g., based on a fixed capacitor). Accordingly, the current I may be varied to change the frequency of the DCO.

In certain aspects, the current I for a DCO may be provided by a DAC of the DCO. Though in certain aspects a DAC is described as providing current to a DCO, it should be noted that similar techniques can be used to apply a signal by the DAC to any load. In certain aspects, the DAC may comprise a plurality of units that selectively supply current to the DCO and correspond to the bits of resolution of the DAC. For example, each of the plurality of units may selectively supply current to the DCO. In certain aspects, each unit of the DAC may supply the same current level. In certain aspects, each of the plurality of units may supply a different current level. For example, the current level of each unit may correspond to the "bit level" of the unit. A DAC may have a resolution of N bits. Accordingly, each unit may supply a current at $(2^N-1)*I$, wherein N is the bit level of the DAC (i.e., 0 to N−1) and I is the lowest current level supplied (e.g., 1 least significant bit (LSB)) by the DAC at the 0 bit level.

Figure 4:
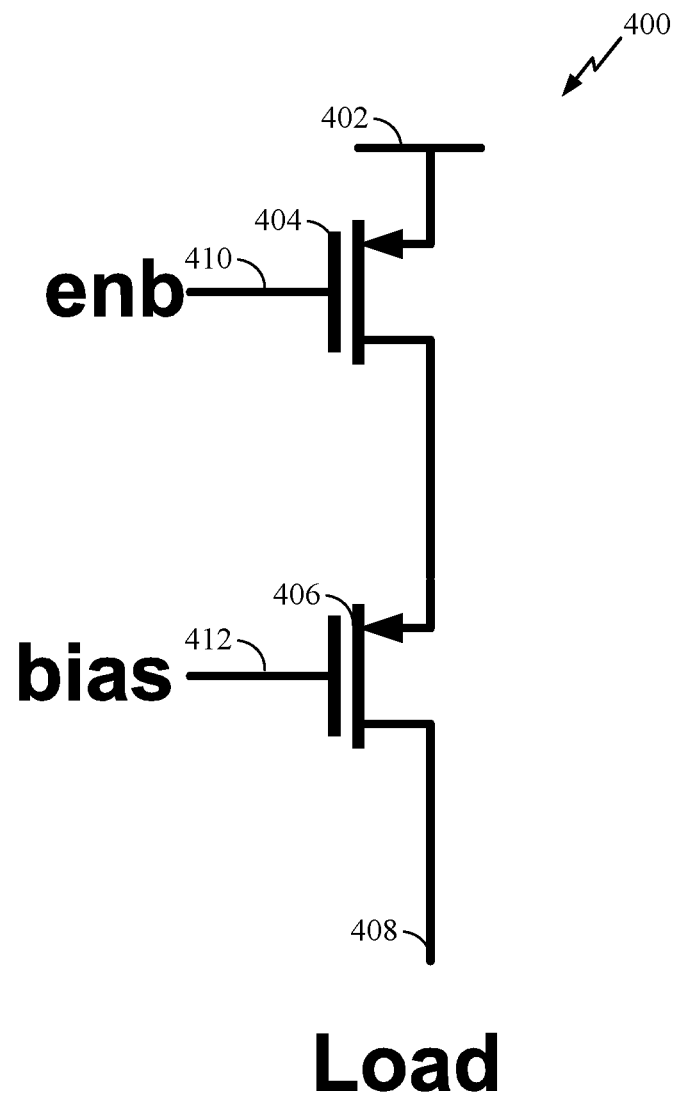
FIG. 4 illustrates a circuit diagram of an example of a unit of a digital-to-analog converter (DAC), in accordance with certain aspects of the present disclosure.

FIG. 4 illustrates a circuit diagram of an example of a unit 400 of a DAC, in accordance with certain aspects of the present disclosure. A DAC with N-bits of resolution may comprise $(2^N-1)$ such units 400. The $(2^N-1)$ units 400 may be coupled in parallel to a load to selectively supply power (e.g., current) to the load. The $(2^N-1)$ units 400 may further be coupled in parallel to a single power supply, to multiple power supplies, or to separate power supplies.

As shown, the unit 400 includes two transistors coupled in series, a first transistor 404 and a second transistor 406. The source terminal of the first transistor 404, as shown, is coupled to a power supply 402 (e.g., current supply, switched-mode power supply, battery, current source, etc.). The drain terminal of the first transistor 404 is coupled to the source terminal of the second transistor 406. The gate terminal of the first transistor 404 is coupled to a path 410 carrying an enabling signal (e.g., enb). The drain terminal of the second transistor 406 is coupled to a load 408 (e.g., a VCO of a DCO). The gate terminal of the second transistor 406 is coupled to a path 412 carrying a bias voltage (e.g., bias). The second transistor 406, as shown, may act as an amplifier.

The first transistor 404, as shown, acts as a switch to either pass current from the power supply 402 to the load 408 or not, based on the enabling signal. For example, when the enabling signal is low, the first transistor 404 may be closed and pass current, while when the enabling signal is high, the first transistor 404 may be open and not pass current, or vice versa depending on the type of transistor. In some aspects, the enabling signal may be generated by a controller (e.g., baseband processor, baseband controller, controller 230, controller 280, processor 242, processor 288, etc.). The controller may selectively generate and apply enabling signals to each unit 400 of the DAC to provide the appropriate current to the load.

In some aspects, a DCO may operate at a wide range of frequencies including low frequencies and high frequencies. Accordingly, the current provided by the DAC of the DCO to the VCO may vary from a low current to a high current. Therefore, in order to support high operating frequencies for the DCO, one or more units of the DAC may selectively pass or not pass a high current. The first transistor 404 of the unit 400, therefore, may be designed to handle a high current.

One way of implementing a switch is by using a transistor (e.g., first transistor 404 in FIG. 4). One factor in reliable switch design is to not exceed the power limits (e.g., current limits) when a switch is off (open). For example, a transistor may have a maximum current limit across the drain and source of the transistor when the transistor is open (e.g., essentially acting as an open switch to decouple an element coupled to the drain from an element coupled to the source). If the current across the drain and source exceeds the limit, the current may leak through the transistor even when the transistor is open. Excessive leakage current reduces the resolution of a DAC and decreases the range of currents the DAC can cover. One way to reduce the leakage current when a transistor is off (open) is to increase the channel length L of the transistor. For example, to reduce the leakage current flowing through the second transistor 406 to the load, the channel length L of the first transistor 404 may be made large. A large first transistor 404 may take up more area to implement the DAC, and therefore increase the cost (e.g., silicon area) to implement the DAC.

Further, a large first transistor 404 with long channel length L may increase the resistance of the first transistor 404. In particular, each transistor may have an associated resistance across the transistor when the transistor is closed (e.g., essentially acting as a closed switch to couple an element coupled to the drain to an element coupled to the source). This resistance may increase with channel length. A large resistance at the first transistor 404 may increase the voltage drop across the first transistor 404, thereby increasing the power needed to supply current to the unit 400, and the overall power consumed by the DAC.

Figure 4A:
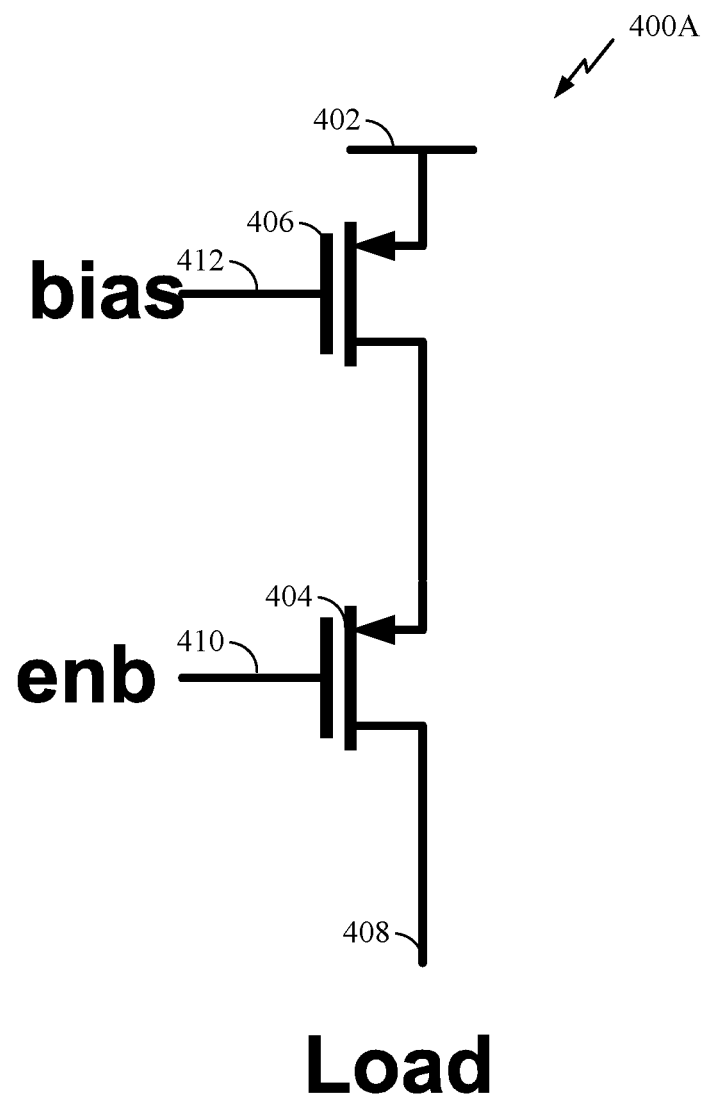
FIG. 4A illustrates a circuit diagram of an example of a unit of a DAC, in accordance with certain aspects of the present disclosure.

FIG. 4A illustrates a circuit diagram of an example of a unit 400A of a DAC, in accordance with certain aspects of the present disclosure. A DAC with N-bits of resolution may comprise (2^N−1) such units 400A. The (2^N−1) units 400A may be coupled in parallel to a load to selectively supply power (e.g., current) to the load.

As shown, the unit 400A is similar to unit 400, however, the position of the first transistor 404 and the second transistor 406 are swapped. In particular, the source terminal of the second transistor 406, as shown, is coupled to the power supply 402, and the drain terminal of the second transistor 406 is coupled to the source terminal of the first transistor 404. The drain terminal of the first transistor 404 is coupled to the load 408.

The function of the unit 400A is similar to the unit 400. The unit 400A, however, may provide improved leakage protection against current that leaks through the first transistor 404 as compared to the unit 400. However, the unit 400A may have an issue with charge injection from the gate of the first transistor 404 to the load 408, since the enb signal may directly inject unwanted charge on the load 408. Further, the unit 400A still may use a large first transistor 404, thereby increasing the cost and power consumed by a DAC utilizing units 400A.

Figure 5:
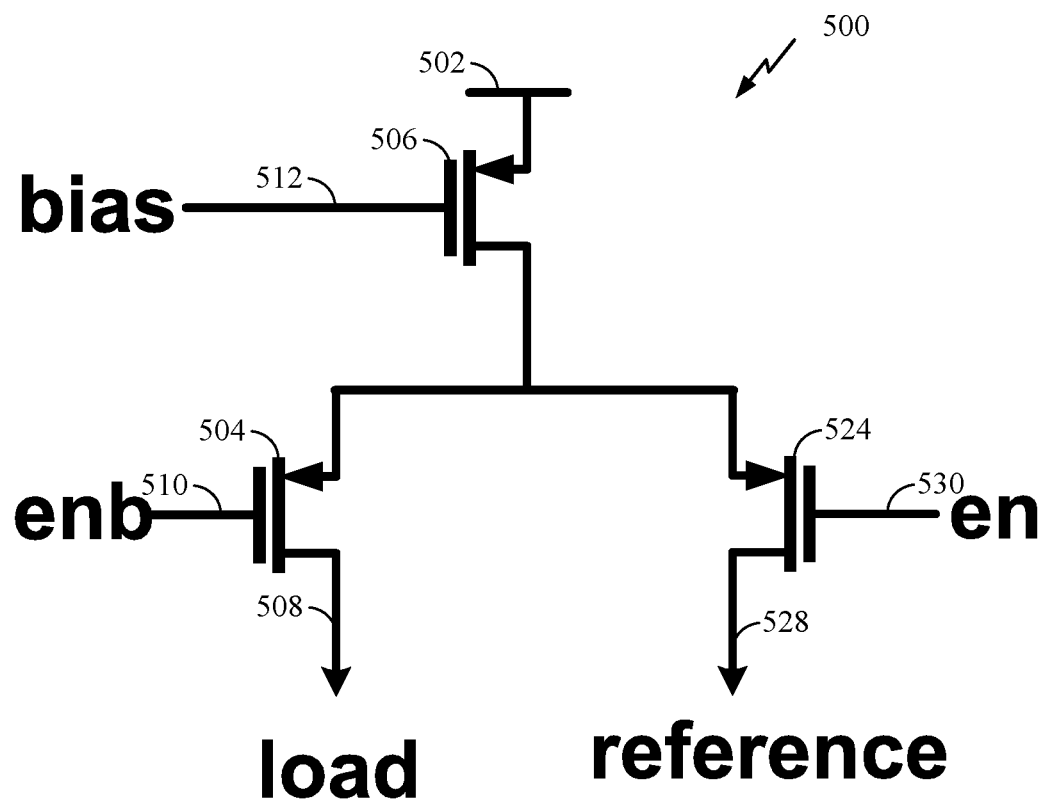
FIG. 5 illustrates a circuit diagram of an example of a unit of a DAC, in accordance with certain aspects of the present disclosure.

FIG. 5 illustrates a circuit diagram of an example of a unit 500 of a DAC, in accordance with certain aspects of the present disclosure. A DAC with N-bits of resolution may comprise (2^N−1) such units 500. The (2^N−1) units 500 may be coupled in parallel to a load to selectively supply power (e.g., current) to the load.

As shown, the unit 500 includes a first transistor 504, a second transistor 506, and a third transistor 524. The source terminal of the second transistor 506 is coupled to a power supply 502 (e.g., current supply, switched-mode power supply, battery, current source, etc.). The drain terminal of the second transistor 506 is coupled to the source terminal of the first transistor 504 and to the source terminal of the third transistor 524. The gate terminal of the second transistor 506 is coupled to a path 512 carrying a bias voltage (e.g., bias). The second transistor 506, as shown, may act as an amplifier.

The gate terminal of the first transistor 504 is coupled to a path 510 carrying an enabling signal (e.g., enb). The drain terminal of the first transistor 504 is coupled to a load 508 (e.g., a VCO of a DCO). The first transistor 504, as shown, acts as a switch to either pass current from the power supply 502 to the load 508 or not, based on the enabling signal. For example, when the enabling signal is low, the first transistor 504 may be closed and pass current, while when the enabling signal is high, the first transistor 504 may be open and not pass current, or vice versa depending on the type of transistor. In some aspects, the enabling signal may be generated by a controller (e.g., baseband processor, baseband controller, controller 230, controller 280, processor 242, processor 288, etc.). The controller may selectively generate and apply enabling signals to each unit 500 of the DAC to provide the appropriate current to the load.

The gate terminal of the third transistor 524 is coupled to a path 530 carrying a signal (en) opposite the enabling signal enb on the path 510. The drain terminal of the third transistor 524 is coupled to a reference (e.g., ground) 528. The third transistor 524, as shown, acts as a switch to either pass current from the power supply 502 to the reference 528 or not, based on the en signal. For example, when the en signal is low, the third transistor 524 may be closed and pass current, while when the en signal is high, the third transistor 524 may open and not pass current, or vice versa depending on the type of transistor. In some aspects, the en signal may be generated by a controller (e.g., baseband processor, baseband controller, controller 230, controller 280, processor 242, processor 288, etc.). The controller may selectively generate and apply en signals to each unit 500.

In certain aspects, the third transistor 524 is opened and closed by the signal en, while the first transistor 504 is opened and closed by the signal enb. The signals en and enb are controlled such that when the first transistor 504 is closed, the third transistor is open, and vice versa. Accordingly, current from the power supply 502 either passes to the load 508 when the first transistor 504 is closed and the third transistor 524 is open, or passes to the reference 528 when the first transistor 504 is open and the third transistor 524 is closed. Since the current from the power supply 502 is always passing to either the load or the reference 528, each of the first transistor 504 and third transistor 524 may not be subject to a large current when open. Accordingly, leakage performance of the unit 500 may be improved over units 400 and 400A in certain implementations. In some such implementations, the transistors 504 and 524 may not need to be as large as the transistor 404, thereby reducing cost (e.g., silicon area) for implementing the DAC.

However, the power consumption of each unit 500 may be increased as current is consumed even when the first transistor 504 is open and current is not applied to the load 508. Further, the timing requirements between signals enb and en may need to be stringent to avoid large charge injection at the load 508. For example, the zero crossing of the signals enb and en may need to match to prevent both the third transistor 524 and first transistor 504 being closed at the same time.

Figure 6:
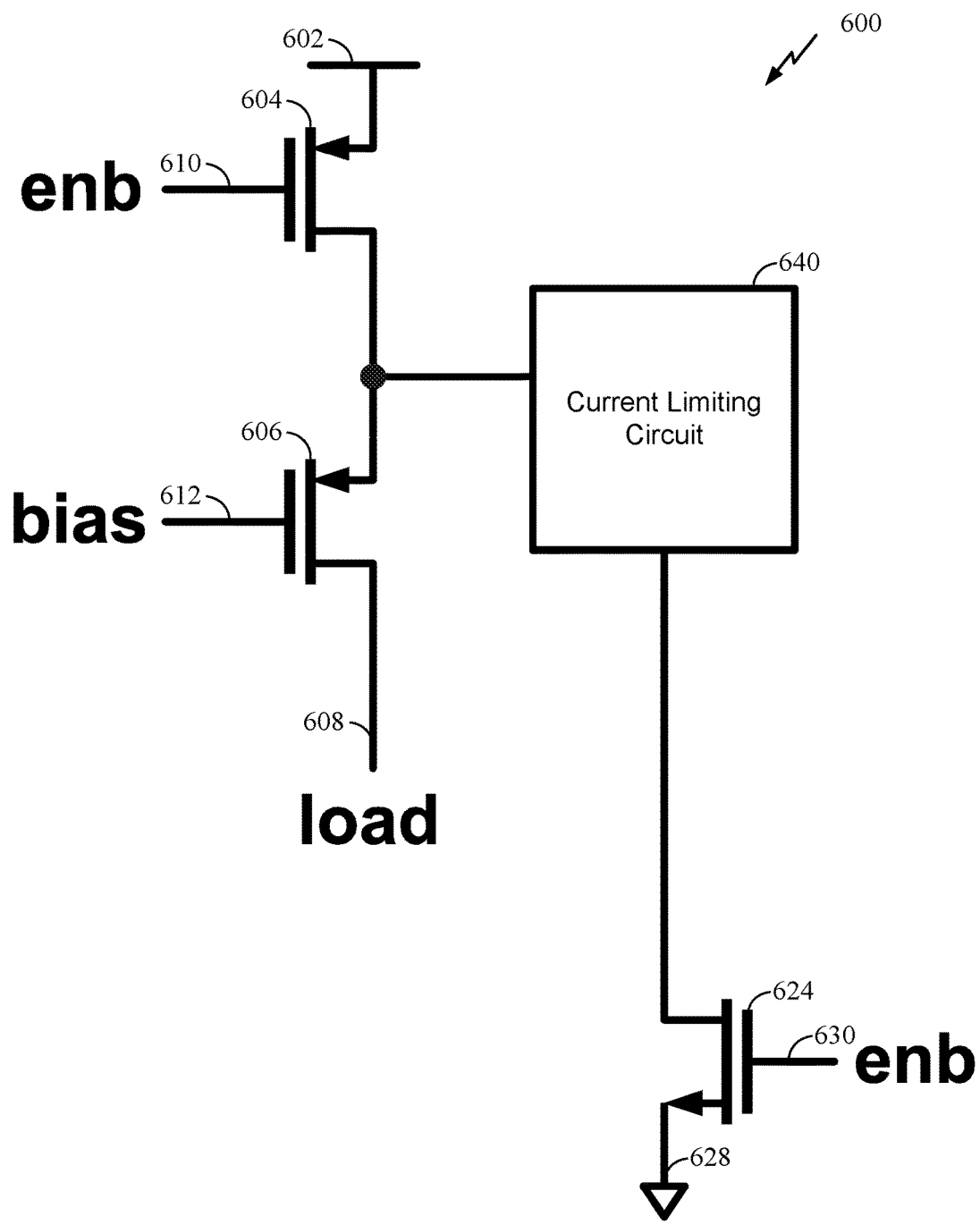
FIG. 6 illustrates a circuit diagram of an example of a unit of a DAC in accordance with certain aspects of the present disclosure.

FIG. 6 illustrates a circuit diagram of an example of a unit 600 of a DAC in accordance with certain aspects of the present disclosure. The unit 600 and/or the DAC may implement leakage compensation. A DAC with N-bits of resolution may comprise (2^N-1) such units 600. The (2^N-1) units 600 may be coupled in parallel to a load to selectively supply power (e.g., current) to the load.

As shown, the unit 600 includes a first transistor 604, a second transistor 606, and a third transistor 624. The unit 600 further includes a current limiting circuit 640. The current limiting circuit 640 is a circuit configured to limit an amount of current passed through the current limiting circuit 640. The current limiting circuit 640 is discussed in more detail below.

The source terminal of the first transistor 604 is coupled to a power supply 602 (e.g., current supply, switched-mode power supply, battery, current source, etc.). The drain terminal of the first transistor 604 is coupled to the source terminal of the second transistor 606 and to the current limiting circuit 640. The gate terminal of the first transistor 604 is coupled to a path 610 carrying an enabling signal (e.g., enb).

The first transistor 604, as shown, acts as a switch to either pass current from the power supply 602 (e.g., to a load 608) or not, based on the enabling signal. For example, when the enabling signal is low, the first transistor 604 may be closed and pass current, while when the enabling signal is high, the first transistor 604 may be open and not pass current, or vice versa depending on the type of transistor. In some aspects, the enabling signal may be generated by a controller (e.g., baseband processor, baseband controller, controller 230, controller 280, processor 242, processor 288, etc.). The controller may selectively generate and apply enabling signals to each unit 600 of the DAC to provide the appropriate current to the load 608 (e.g., a VCO of a DCO). In some embodiments, the high signal is supplied by the power supply 602. In other embodiments, the high signal is separately supplied and/or comprises a value different than a current or voltage value supplied by the power supply 602. In some embodiments, the low signal comprises a ground voltage. In other embodiments, the low signal comprises a signal of another reference value.

The drain terminal of the second transistor 606 is coupled to the load 608, for example a VCO of a DCO. The gate terminal of the second transistor 606 is coupled to a path 612 carrying a bias voltage (e.g., bias). The second transistor 606, as shown, may act as an amplifier. The current limiting circuit 640 is further coupled to the drain terminal of the third transistor 624, and to a node between the drain of the first transistor 604 and the source of the second transistor 606.

The gate terminal of the third transistor 624 is coupled to a path 630 carrying the enabling signal enb. The source terminal of the third transistor 624 is coupled to a reference (e.g., reference voltage, ground) 628. The third transistor 624, as shown, acts as a switch to either pass current from the drain terminal of the first transistor 604 to the reference 628 or not, based on the enb signal. For example, when the enabling signal enb is high, the third transistor 624 may be closed and pass current, while when the enabling signal enb is low, the third transistor 624 may be open and not pass current, or vice versa depending on the type of transistor. In particular, the third transistor 624 is configured to selectively enable or disable the path with the current limiting circuit 640.

In certain aspects, the operation (e.g., opening/closing) of the third transistor 624 is opposite the operation of the first transistor 604 based on the enabling signal. For example, when the first transistor 604 is closed based on the enabling signal, the third transistor 624 is open based on the enabling signal. Accordingly, current from the power supply 602 passes to the load 608 when the first transistor 604 is closed and the third transistor 624 is open. Further, since the third transistor 624 is open, current does not pass through the path with the current limiting circuit 640 to the reference 628.

In addition, when the first transistor 604 is open based on the enabling signal, the third transistor 624 is closed based on the enabling signal. Accordingly, current from the power supply 602 is prevented from passing to the load 608 by the open first transistor 604. In some embodiments, the signal supplied at path 610 may be the same signal as supplied at the path 630, or the signals may have similar values even if separately supplied. In other embodiments, the signal supplied at 610 may differ in value from the signal supplied at 630, but both may concurrently maintained in a "high" state or concurrently maintained in a "low" state. In some embodiments, the transistors 604 and 624 may therefore be controlled to have opposite (open vs. closed) states while reducing the difficulties in the timing requirements discussed with respect to FIG. 5.

As previously discussed, if the current level is above a current limit of the first transistor 604 in some implementations, some of the current from the power supply 602 may leak across the first transistor 604 from the source terminal of the first transistor 604 to the drain terminal of the first transistor 604. Since the third transistor 624 is closed, the leakage current can pass through the path with the current limiting circuit 640 to the reference 628, and the leakage current is prevented from reaching the load 608, or in some embodiments an amount of leakage current reaching the load 608 is reduced as compared to embodiments described above with respect to FIGS. 4-5.

In particular, the current limiting circuit 640 may be configured to limit the amount of current that is passed, such as from the first transistor 604 (e.g., drain terminal of the first transistor 604) to the reference 628. By limiting the current passed from the first transistor 604 to the reference 628, the amount of leakage current from the first transistor 604 to the load 608 may be significantly reduced as it passes to the reference 628 instead of the load 608. For example, leakage performance of the unit 600 may be improved over units 400 and 400A, and therefore the transistors 604 and 624 may not need to be as large as the transistor 404, thereby reducing cost (e.g., silicon area) for implementing the DAC. Further, unlike unit 500, excessive current (e.g., excessive beyond the leakage current from the first transistor 604) is not consumed when the first transistor 604 is open, because the current limiting circuit 640 limits the amount of current passed and therefore consumed by the unit 600. Therefore the power consumption of each unit 600 may be improved over the unit 500.

In certain aspects, to further improve the performance of the unit 600, properties of the current limiting circuit 640 may be matched to the first transistor 604. When the current limiting circuit 640 is matched to the first transistor 604, the amount of current passed through the path with the current limiting circuit 640 to the reference 628 may be approximately equal to the leakage current from the first transistor 604 when it is closed. Therefore, if the current limiting circuit 640 is matched or has approximately the same properties as the first transistor 604, the leakage current to the load 608 may be significantly reduced as it passes to the reference 628 instead of the load 608. Further, the excess current consumed beyond the leakage current is further reduced or in certain aspects, close to 0.

In certain aspects, the current limiting circuit 640 may comprise one or more resistors, or one or more current mirrors that are configured to limit the current passed. However, in certain aspects, configuring or selecting the one or more resistors, or one or more current mirrors to match the leakage current of the first transistor 604 may be difficult and/or may take up valuable space (e.g., silicon area) to implement. For example, the amount of current passed in such implementations may depend on variable properties of the circuit, such as, voltage, temperature, etc.

Figure 6A:
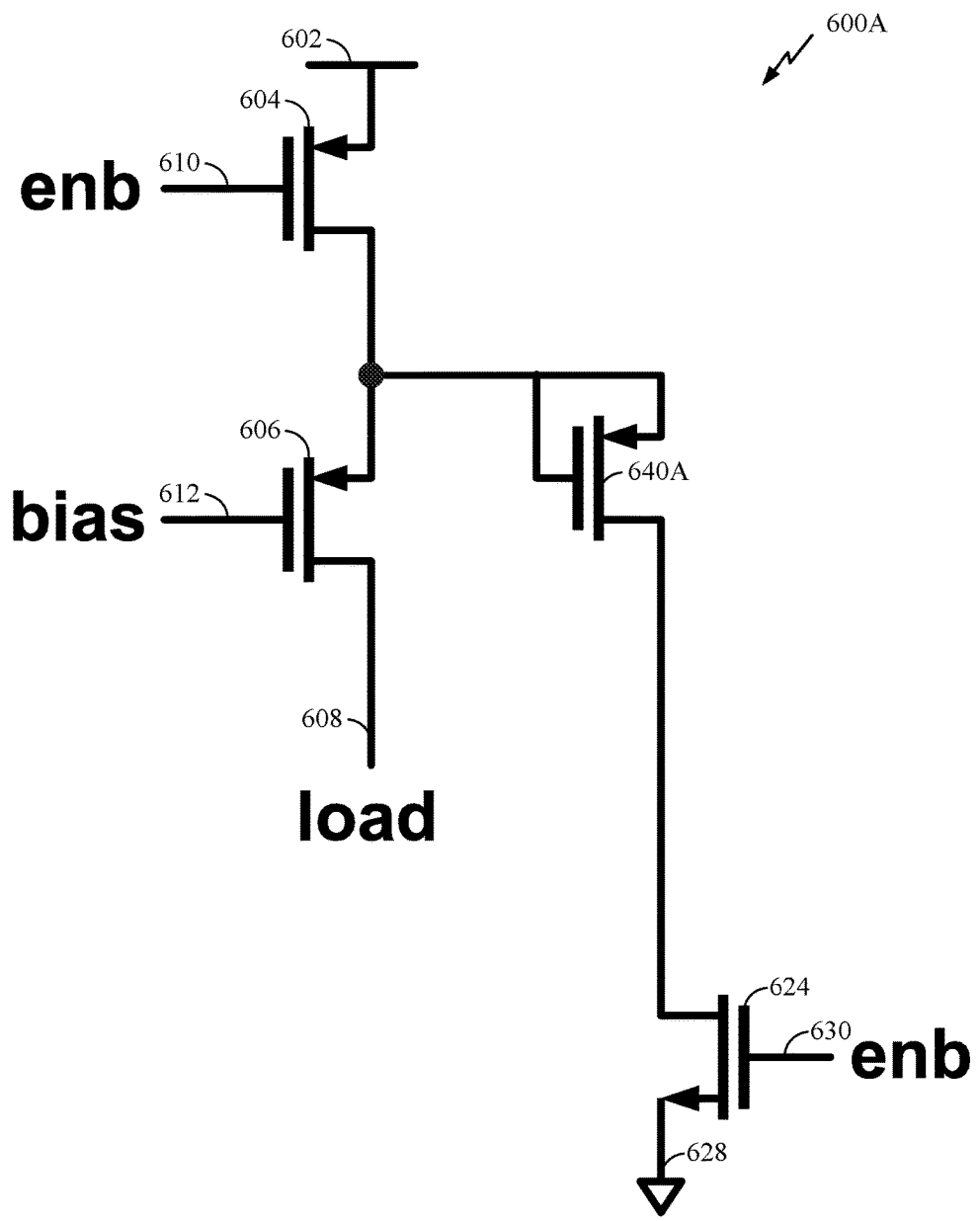
FIG. 6A illustrates a circuit diagram of another example of a unit of a DAC in accordance with certain aspects of the present disclosure.

Accordingly, in certain aspects, as shown in FIG. 6A, the current limiting circuit 640 includes a transistor 640A. In particular, in certain aspects the transistor 640A has matching or at least approximately matching properties as the first transistor 604. Therefore, when the transistor 640A is open (e.g., off), it has at least approximately the same leakage current as the first transistor 604. Thus, when the transistor 640A is open it limits the amount of current passed between the source terminal and drain terminal of the transistor 640A to the same current level as the leakage current of the first transistor 604. As shown, in certain aspects, the source terminal of the transistor 640A is coupled to the gate terminal of the transistor 640A, for example, to keep the transistor 640A in an open state. The drain terminal of the first transistor 604 is coupled to the source terminal and gate terminal of the transistor 640A. The drain terminal of the transistor 640A is coupled to the drain terminal of the third transistor 624. By using a matching transistor 640A to the first transistor 604 as discussed, the current limiting provided by the current limiting circuit 640 may be more easily matched to the leakage current of the first transistor 604, and further may be matched even as variable properties of the circuit change. Further, the space (e.g., silicon area) to implement the current limiting circuit 640 using a transistor 640A may be reduced.

The embodiments shown in FIGS. 6 and 6A include two (or three) transistors illustrated as PMOS transistors and one transistor illustrated as an NMOS transistor. Embodiments implemented pursuant to the present disclosure are not, however, limited to such configurations. In some embodiments, transistors of other types may be implemented or used, for example in combination with the current limiting circuit described above. In one example, a majority of NMOS transistors are used, as illustrated n FIGS. 6B and 6C. In other examples, a few number of transistors are used or a different combination of transistors and/or transistors types are implemented.

Figure 6B:
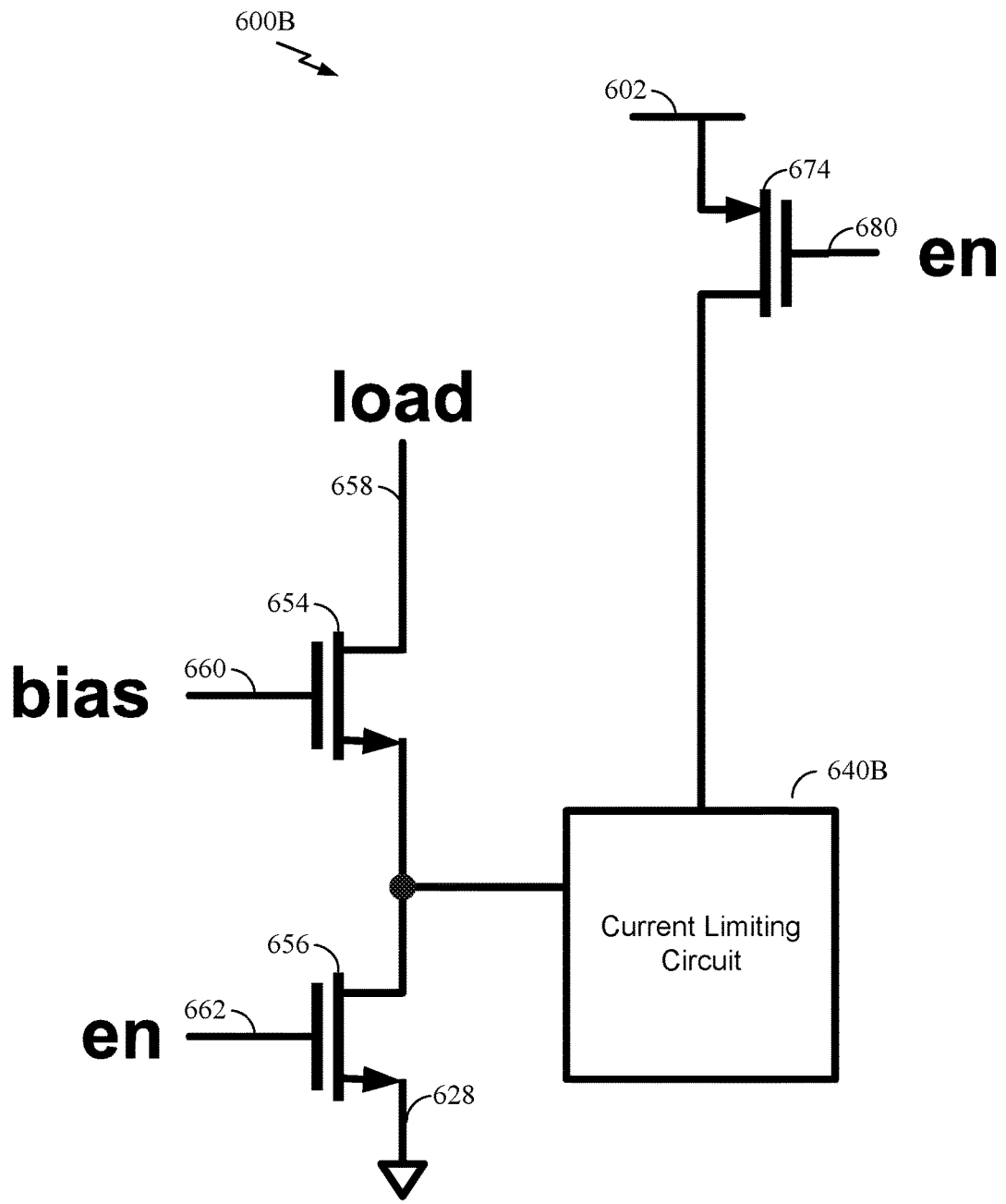
FIG. 6B illustrates a circuit diagram of another example of a unit of a DAC in accordance with certain aspects of the present disclosure.

FIG. 6B illustrates a circuit diagram of an example of a unit 600B of a DAC in accordance with certain aspects of the present disclosure. The unit 600B and/or the DAC may implement leakage compensation. A DAC with N-bits of resolution may comprise (2^N−1) such units 600. The (2^N−1) units 600B may be coupled in parallel to a load to selectively supply power (e.g., current) to the load.

The unit 600B illustrated in FIG. 6B includes a first transistor 656, a second transistor 654, a third transistor 674, a current limiting circuit 640B. The first transistor 656 has a source terminal coupled to the reference (e.g., reference voltage, ground) 628 and a drain terminal coupled to a source terminal of the second transistor 654. A gate terminal of the first transistor is coupled to a path 662 carrying an enabling signal (e.g., en). When the enabling signal is high, the first transistor 656 may be closed and pass current, while when the enabling signal is low, the first transistor 656 may be open and not pass current.

A drain of the second transistor 654 may be coupled to a load 658, for example which may include a VCO of a DCO. A gate terminal of the second transistor 654 is coupled to a path 660 carrying a bias voltage (e.g., bias).

The third transistor 674 has source terminal coupled to the power supply 602. A drain terminal of the third transistor 674 is coupled to the current limiting circuit 640B. A gate terminal of the third transistor 674 is coupled to a path 680 carrying an enabling signal (e.g., en). When the enabling signal is high, the third transistor 674 may be closed and pass current, while when the enabling signal is low, the third transistor 674 may be open and not pass current. In some embodiments, the signal supplied at path 662 may be the same signal as supplied at the path 680, or the signals may have similar values even if separately supplied. In other embodiments, the signal supplied at 662 may differ in value from the signal supplied at 680, but both may concurrently maintained in a "high" state or concurrently maintained in a "low" state. In some embodiments, the transistors 656 and 674 may therefore be controlled to have opposite (open vs. closed) states. In some embodiments, the high signal is supplied by the power supply 602. In other embodiments, the high signal is separately supplied and/or comprises a value different than a current or voltage value supplied by the power supply 602. In some embodiments, the low signal comprises a ground voltage. In other embodiments, the low signal comprises a signal of another reference value.

The current limiting circuit 640B is coupled to the drain of the third transistor 674, and to a node between the drain of the first transistor 656 and the second transistor 654. As discussed above with respect to the circuit 640, the current limiting circuit 640B may comprise one or more resistors, or one or more current mirrors that are configured to limit the current passed. In certain aspects, the current limiting circuit 640B is matched or has approximately the same properties as the first transistor 656 and/or the third transistor 674.

Figure 6C:
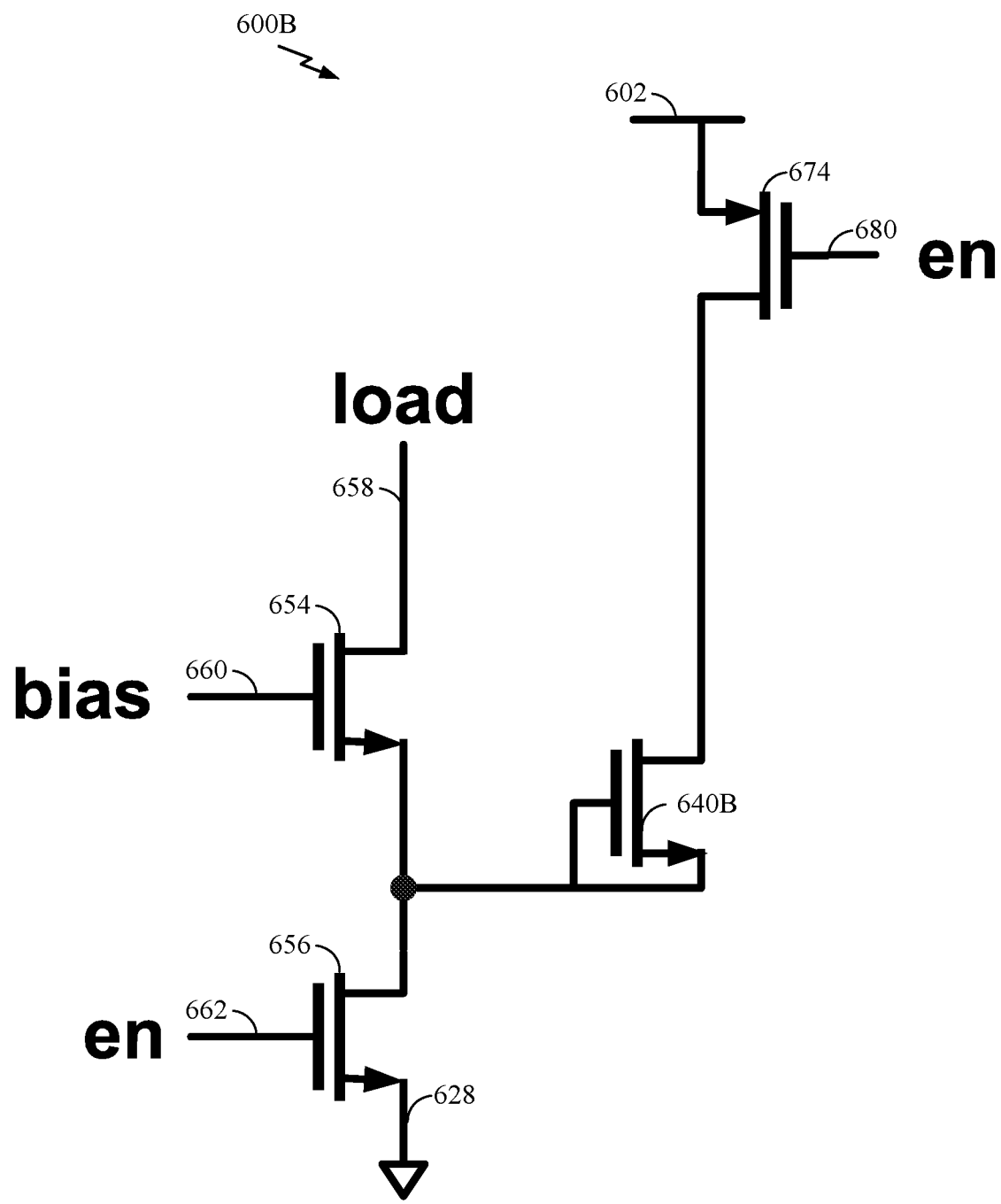
FIG. 6C illustrates a circuit diagram of another example of a unit of a DAC in accordance with certain aspects of the present disclosure.

In certain aspects, as shown in FIG. 6C, the current limiting circuit 640 includes a transistor 640C. In particular, in certain aspects the transistor 640C has matching or at least approximately matching properties as the first transistor 656 and/or the third transistor 674. As shown, in certain aspects, a source terminal of the transistor 640C is coupled to the gate terminal of the transistor 640C. A drain terminal of the first transistor 656 is coupled to the source terminal and gate terminal of the transistor 640C. The drain terminal of the transistor 640C is coupled to the drain terminal of the third transistor 674.

Figure 7:
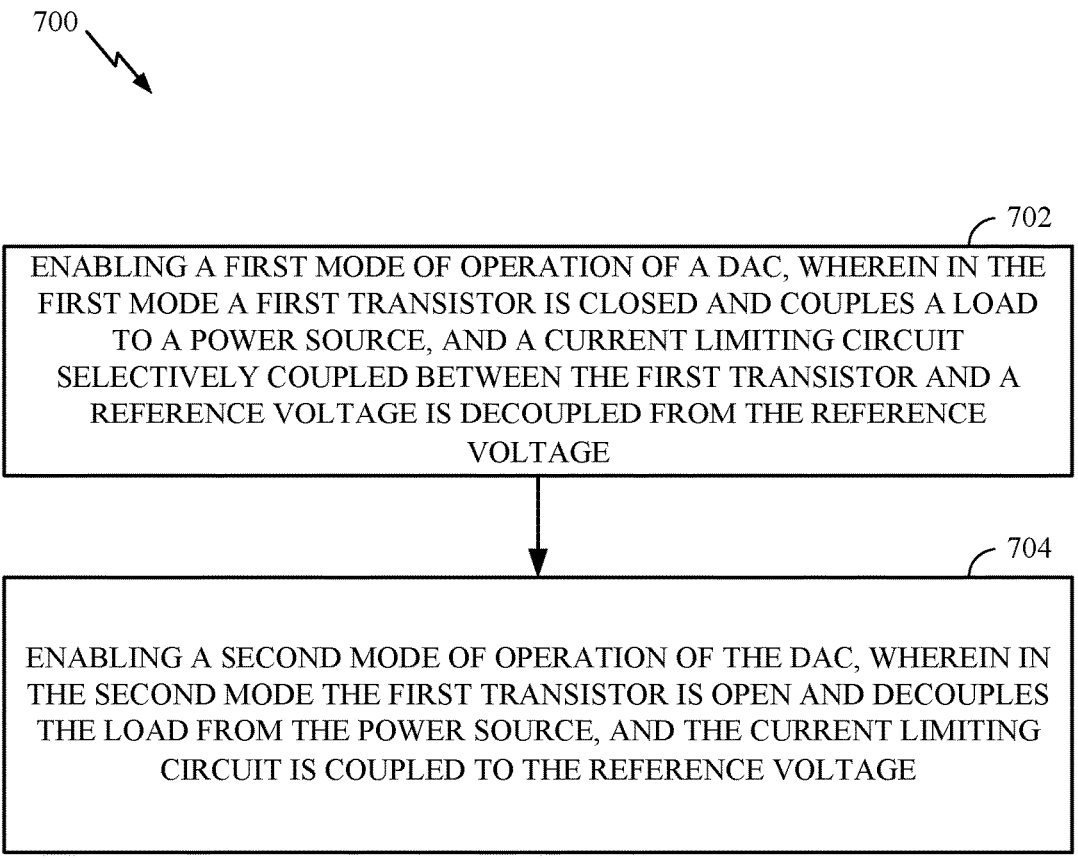
FIG. 7 is a flow diagram of example operations for operating a DAC in accordance with certain aspects of the present disclosure.

FIG. 7 is a flow diagram of example operations 700 for operating a DAC, for example a DAC with leakage compensation, in accordance with certain aspects of the present disclosure.

The operations 700 may begin at block 702 where a first mode of operation of a DAC is enabled. In the first mode a first transistor of a unit (e.g., the transistor 604 or 674) of the DAC is closed and couples a load to a power source, and a current limiting circuit (e.g., the current limiting circuit 640-640C) selectively coupled between the first transistor and a reference voltage is decoupled from the reference voltage. For example, the unit of the DAC may be the unit 600-600C and the mode of operation of the DAC may be based on an enabling signal applied to the unit (e.g., over the path 610 or 680). In certain aspects, the current limiting circuit may be matched to the first transistor.

At a block 704, a second mode of operation of the DAC is enabled. In the second mode the first transistor is open and decouples the load from the power source, and the current limiting circuit is coupled to the reference voltage. For example, the unit of the DAC may be the unit 600 and the mode of operation of the DAC may be based on an enabling signal applied to the unit.

Figure 8:
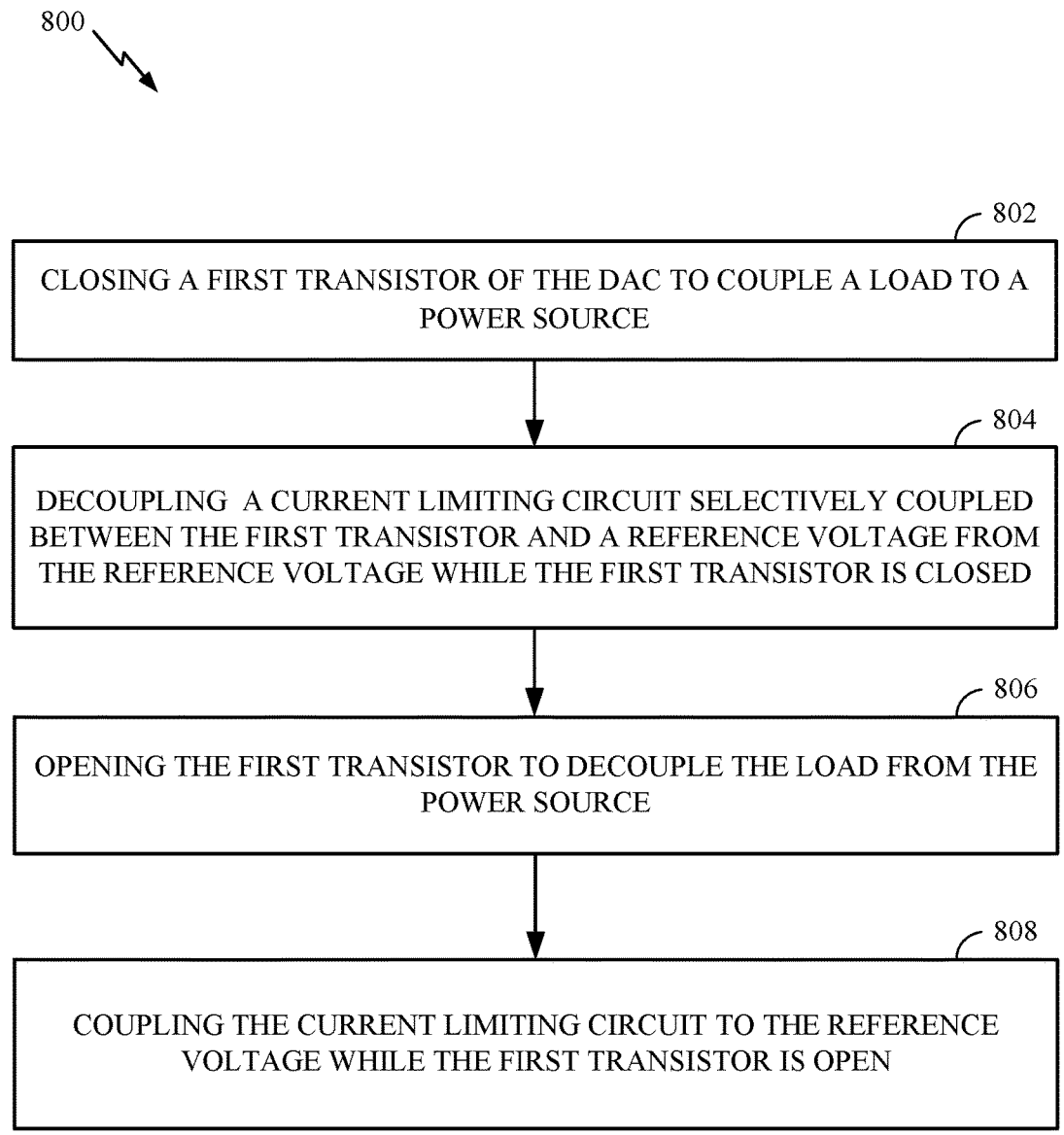
FIG. 8 is a flow diagram of example operations for operating a DAC in accordance with certain aspects of the present disclosure.

FIG. 8 is a flow diagram of example operations 800 for operating a DAC, for example a DAC with leakage compensation, in accordance with certain aspects of the present disclosure.

At block 802 a first transistor (e.g., the transistor 604 or 674) of (e.g., a unit of) the DAC is closed to couple a load to a power source. For example, the unit of the DAC may be the unit 600-600C. The closing of the transistor, and the decoupling of the current limiting circuit, may be based on an enabling signal applied to the unit (e.g., over the path 610 or 680).

At block 804, a current limiting circuit (e.g., the current limiting circuit 640-640C) selectively coupled between the first transistor and a reference voltage is decoupled from the reference voltage while the first transistor is closed. In certain aspects, the current limiting circuit may be matched to the first transistor.

At a block 806, the first transistor is opened to decouple the load from the power source, and at block 808 the current limiting circuit is coupled to the reference voltage while the first transistor is open. For example, the unit of the DAC may be the unit 600 and the opening of the first transistor, and the coupling of the current limiting circuit, may be based on an enabling signal applied to the unit.

In certain aspects, as discussed, the DAC may include additional units that may be operated independently of each other to selectively apply a current to a load. For example, the DAC may include a second transistor selectively coupled in parallel with the first transistor between the power source and the load, and a second current limiting circuit selectively coupled between the second transistor and the reference voltage. The selective coupling of the second transistor and second current limiting circuit may be the same or the opposite as the first transistor and current limiting circuit for a given mode of operation, where each mode of operation may correspond to a different current level to be supplied by the DAC. For example, if a given mode of operation includes current supplied via both a first unit and a second unit to a load, the operation of the units may be the same for that mode of operation. If a given mode of operation includes current supplied via only one of a first unit and a second unit to a load, the operation of the units may be the opposite for that mode of operation.

The various operations or methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A digital-to-analog converter (DAC) comprising:
   a first transistor configured to selectively couple a power source to a load, wherein in a first mode of operation of the DAC the first transistor is closed and couples the load to the power source, and in a second mode of operation of the DAC the first transistor is open and decouples the load from the power source; and
   a current limiting circuit selectively coupled between the first transistor and a reference voltage, wherein in the first mode the current limiting circuit is decoupled from the reference voltage and in the second mode the current limiting circuit is coupled to the reference voltage.

2. The DAC of claim 1, further comprising a second transistor coupled between the first transistor and the load, the second transistor further being coupled to a bias voltage.

3. The DAC of claim 1, wherein the current limiting circuit comprises a second transistor.

4. The DAC of claim 3, wherein the second transistor is matched to the first transistor.

5. The DAC of claim 4, wherein a gate terminal of the second transistor is coupled to a source terminal of the second transistor.

6. The DAC of claim 1, wherein the current limiting circuit generates a current that substantially matches a leakage current of the first transistor.

7. The DAC of claim 1, further comprising a third transistor coupled between the current limiting circuit and the reference voltage, wherein the third transistor selectively couples the current limiting circuit to the reference voltage.

8. The DAC of claim 1, further comprising a controller configured to apply a control signal to a gate terminal of the first transistor.

9. The DAC of claim 8, wherein the controller is further configured to apply the control signal to a gate terminal of a third transistor coupled between the current limiting circuit and the reference voltage.

10. The DAC of claim 1, wherein the load comprises a voltage-controlled oscillator.

11. The DAC of claim 1, further comprising:
    a second transistor configured to selectively couple the power source to the load in parallel with the first transistor; and
    a second current limiting circuit selectively coupled between the second transistor and the reference voltage.

12. The DAC of claim 11, wherein in the first mode of operation of the DAC the second transistor is closed and couples the load to the power source, and in the second mode of operation of the DAC the second transistor is open and decouples the load from the power source, and wherein in the first mode the second current limiting circuit is decoupled from the reference voltage and in the second mode the second current limiting circuit is coupled to the reference voltage.

13. The DAC of claim 11, wherein in the second mode of operation of the DAC the second transistor is closed and couples the load to the power source, and in the first mode of operation of the DAC the second transistor is open and decouples the load from the power source, and wherein in the second mode the second current limiting circuit is decoupled from the reference voltage and in the first mode the second current limiting circuit is coupled to the reference voltage.

14. A method for operating a digital-to-analog converter (DAC), the method comprising:
    closing a first transistor of the DAC to couple a load to a power source;
    decoupling a current limiting circuit selectively coupled between the first transistor and a reference voltage from the reference voltage while the first transistor is closed;
    opening the first transistor to decouple the load from the power source; and
    coupling the current limiting circuit to the reference voltage while the first transistor is open.

15. The method of claim 14, wherein the DAC further comprises a second transistor coupled between the first transistor and the load, the second transistor further being coupled to a bias voltage.

16. The method of claim 14, wherein the current limiting circuit comprises a second transistor.

17. The method of claim 16, wherein the second transistor is matched to the first transistor.

18. The method of claim 17, wherein a gate terminal of the second transistor is coupled to a source terminal of the second transistor.

19. The method of claim 14, further comprising generating a current with the current limiting circuit that substantially matches a leakage current of the first transistor.

20. The method of claim 14, wherein the DAC further comprises a third transistor coupled between the current limiting circuit and the reference voltage, wherein the third transistor selectively couples the current limiting circuit to the reference voltage.

21. The method of claim 14, further comprising applying a control signal to a gate terminal of the first transistor.

22. The method of claim 21, further comprising applying the control signal to a gate terminal of a third transistor coupled between the current limiting circuit and the reference voltage.

23. The method of claim 14, further comprising driving a voltage-controlled oscillator.

24. The method of claim 14, wherein the DAC further comprises:
    selectively coupling the power source to the load through a second transistor in parallel with the first transistor; and
    selectively coupling a second current limiting circuit between the second transistor and the reference voltage.

25. The method of claim 24, further comprising closing the second transistor to couple the load to the power source and decoupling the second current limiting circuit from the reference voltage while the first transistor is closed, and opening the second transistor to decouple the load from the power source and coupling the second current limiting circuit to the reference voltage while the first transistor is open.

26. The method of claim 24, further comprising closing the second transistor to couple the load to the power source and decoupling the second current limiting circuit from the reference voltage while the first transistor is open, and opening the second transistor to decouple the load from the power source and coupling the second current limiting circuit to the reference voltage while the first transistor is closed.

27. An apparatus for converting a digital signal to an analog signal, comprising:
   a first transistor coupled between ground and a first node, a gate of the first transistor being coupled to a first control signal;
   a second transistor coupled between the first node and a load, a gate of the second transistor being coupled to a bias voltage;
   a third transistor having a gate and a source coupled to the first node; and
   a fourth transistor coupled between a drain of the third transistor and a power supply, a gate of the fourth transistor being coupled to a second control signal.

28. An apparatus for converting a digital signal to an analog signal, comprising:
   a first transistor coupled between a power supply and a first node, a gate of the first transistor being coupled to a first control signal;
   a second transistor coupled between the first node and a load, a gate of the second transistor being coupled to a bias voltage;
   a third transistor having a gate and a source coupled to the first node; and
   a fourth transistor coupled between a drain of the third transistor and ground, a gate of the fourth transistor being coupled to a second control signal.

29. The apparatus of claim 28, wherein the first control signal and the second control signal are the same signal.

30. The apparatus of claim 28, wherein the load comprises a digitally controlled oscillator.

* * * * *